(12) United States Patent
Grayzel

(10) Patent No.: US 10,084,054 B2
(45) Date of Patent: Sep. 25, 2018

(54) FIELD EFFECT TRANSISTOR WHICH CAN BE BIASED TO ACHIEVE A UNIFORM DEPLETION REGION

(71) Applicant: Alfred I. Grayzel, Park City, UT (US)

(72) Inventor: Alfred I. Grayzel, Park City, UT (US)

( * ) Notice: Subject to any disclaimer, the term of this patent is extended or adjusted under 35 U.S.C. 154(b) by 0 days.

(21) Appl. No.: 15/920,250

(22) Filed: Mar. 13, 2018

(65) Prior Publication Data
US 2018/0204925 A1    Jul. 19, 2018

Related U.S. Application Data

(63) Continuation-in-part of application No. 15/613,707, filed on Jun. 5, 2017.

(60) Provisional application No. 62/392,508, filed on Jun. 3, 2016.

(51) Int. Cl.
*H01L 29/423* (2006.01)
*H01L 29/10* (2006.01)
*H01L 29/40* (2006.01)

(52) U.S. Cl.
CPC .... *H01L 29/42376* (2013.01); *H01L 29/1033* (2013.01); *H01L 29/405* (2013.01)

(58) Field of Classification Search
CPC ............. H01L 29/42376; H01L 29/405; H01L 29/1033
See application file for complete search history.

(56) References Cited

U.S. PATENT DOCUMENTS

| | | | |
|---|---|---|---|
| 3,654,499 A | 4/1972 | Smith | |
| 3,678,347 A | 7/1972 | Tulp | |
| 4,085,456 A | 4/1978 | Tompsett | |
| 2017/0186860 A1* | 6/2017 | Wong | ........... H01L 29/7787 |
| 2017/0352757 A1 | 12/2017 | Grayzel | |

OTHER PUBLICATIONS

Collier "Novel Dual-gate HEMT Utilising Multiple Split Gates" Microelectronic Engineering 41/42 (1998), pp. 457-460.
Cripps "RF Power Amplifiers for Wireless Communications" Artech House, Inc., 2nd Edition, 2006.
Dennler "Modeling and realization of GaN-based dual-gate HEMTs and HPA MMICs for Ku-band applications" Microwave Symposium Digest (MTT) Jun. 2011.
Dennler "Watt-Level Non-Uniform Distributed 6-37 GHz Power Amplifier MMIC with Dual-Gate Driver Stage in GaN Technology" IEEE Conference on Power Amplifiers for Wireless and Radio Applications (PAWR), Jan. 19-23, 2014.
Gao "High Efficiency Class F Microwave Power Amplifiers" IEEE Microwave Magazine, Feb. 2006.

(Continued)

*Primary Examiner* — John P Dulka
(74) *Attorney, Agent, or Firm* — Workman Nydegger

(57) ABSTRACT

A Field Effect Transistor includes a channel with one end designated the source and the other end designated the drain. The Field Effect Transistor also includes a means for connecting to said source end of said channel and a means for connecting to said drain end of said channel. A gate is divided into a plurality of segments each insulated from one another. A means for adjusting the bias of each of said segments independently of one another is configured whereby the depletion region in said channel can be adjusted to avoid pinch-off and to maximize the efficiency of said Field Effect Transistor.

20 Claims, 9 Drawing Sheets

(56) References Cited

OTHER PUBLICATIONS

Grayzel "Analyze RF JFETs for Large-Signal Behavior" Microwave and RF, Jan. 23, 2017.
Peterson "How It Works: The Charged-Coupled Device, or CCD" Journal of Young Investigators, 2001.
Pierret "Semiconductor Device Fundamentals" Figs. 15.2, 15.3, 15.4 and 15.5, 1996.
Raab "Maximum Efficiency and Output of Class F Power Amplifiers" Transactions on Microwave Theory and Techniques, vol. 40, No. 6, Jun. 2001, pp. 1162-1166.
Shur "Split-gate filed-effect transitor" Applied Physics Letters 54(2), Jan. 9, 1989.
Tsironis, "Microwave Wide-Band Model of GaAs Dual Gate MESFET's" IEEE Transactions on Microwave Theory and Techniques, Vo. MTT-30, No. 3, Mar. 1982.
U.S. Appl. No. 15/613,707, Nov. 17, 2017, Office Action.

\* cited by examiner

FIELD EFFECT TRANSISTOR WHICH CAN BE BIASED TO ACHIEVE A UNIFORM DEPLETION REGION

CROSS REFERENCE TO RELATED APPLICATIONS

This application is a continuation-in-part of U.S. application Ser. No. 15/613,707, filed Jun. 5, 2017, and entitled "FIELD EFFECT TRANSISTOR WHICH CAN BE BIASED TO ACHIEVE A UNIFORM DEPLETION REGION," which claims priority to and the benefit of U.S. Provisional Application No. 62/392,508, filed Jun. 3, 2016, and entitled "Field Effect Transistor Which has a Uniform Depletion Region Across its Length and Hence Does Not Experience Pinchoff." Each of the above referenced applications is incorporated by reference herein in its entirety.

FIELD OF INVENTION

This invention relates to Field Effect Transistors.

BACKGROUND OF THE INVENTION

A conventional Field Effect Transistor has a channel whose resistance is a function of the gate voltage. Conventional Field Effect transistors have a semiconductor channel with one end labeled the source and the second end labeled the drain. In addition, Field Effect transistors have a gate whose voltage controls the resistance of the channel. Current flowing through the channel is therefore a function of the gate voltage. The gate voltage controls the resistance by creating a depletion region across the channel. In the depletion region, there are no majority carriers; just minority carriers. The width of the depletion region along the channel is a function of the gate voltage.

Under normal operation a voltage is applied to the gate here-to-for referred to as the gate voltage, which is comprised of an RF signal and a DC bias voltage here-to-for referred to as the bias voltage. Said bias voltage is used to set the average value of the gate voltage.

FETs include but are not limited to JFET, n-type JFET, p-type JFET, MOSFET, NMOSFET, PMOSFET NMOSFET, MNOSFET, DIGMOSFET, HIGFET, TFET, HEMPT, MESFET, and the CMOSFET in the enhancement mode and in the depletion mode.

FIG. 1A illustrates a Junction Field Effect Transistor (JFET) according to prior art. It shows as an example a schematic of an idealized n-type JFET fabricated by the standard epitaxial process. The active region of the device consists of a lightly doped n-type channel 10 sandwiched between a highly doped p+ region 12 and a highly doped p+ region 14. A gate terminal 18 is connected to a metal gate electrode 20 which makes electrical contact with the p+ region 14. The p+ region 14 forms a p-n junction with the lightly doped n-type channel 10. The highly doped p+ region 12 makes electrical contact with a metal back electrode 16. A source terminal 22 is connected to a metal source electrode 24 which makes electrical contact with the n-type channel 10. A drain terminal 26 is connected to a metal drain electrode 28, which makes electrical contact with the n-type channel 10.

Within the n-type JFET during normal operations the gate is biased with a negative voltage. In particular, a p-n junction is back biased when the p side is negative with respect to the n side of the junction. A negative voltage on the gate terminal 18 back-biases the p-n junction comprised of the p+ region 14 and the lightly doped n-type channel 10. Back-biasing this junction creates a depletion region whose width is a function of the negative voltage applied to the gate terminal 18. Thus, varying the negative voltage on the gate terminal 18 changes the width of the depletion region, which causes the resistance of the lightly doped n-type channel 10 to vary. A positive voltage in the lightly doped n-type channel 10, will also back-bias the p-n junction comprised of the p+ region 14 and the lightly doped n-type channel 10.

FIG. 1B shows the voltage distribution along the lightly doped n-type channel 10 for the JFET shown in FIG. 1A, when a positive direct current (DC) voltage is applied to the drain terminal 26 by a seven-volt battery 30 and the source terminal 22 and the metal back electrode 16 are connected to ground. The voltage in the lightly doped n-type channel 10 due to the seven volts drain voltage back-biases the p-n junction which is comprised of the p+ region 14 and the lightly doped n-type channel 10. This back-bias is greatest at the drain, where the voltage in the lightly doped n-type channel 10 is seven volts at the drain and is least at the source where the voltage in the lightly doped n-type channel 10 is zero volts. The voltage drops from the metal source electrode 24 to the start of the depletion region and the voltage drop from the metal drain electrode 28 to the end of the depletion region have been neglected to simplify this discussion.

The back bias, due to the drain voltage, causes a depletion region along the channel. In the depletion region the majority carriers, electrons in the case of the n-type JFET, are removed and only minority carriers remain. The larger the back-bias the greater will be the width of the depletion region and therefore, the higher the resistance of the channel. Thus, the width of the depletion region and therefore, the resistance of the channel will be greatest at the drain and will be smallest at the source. The change in voltage per unit length in the lightly doped n-type channel 10 varies, as shown in FIG. 1B, since the resistance of the channel varies due to the variation of the width of the depletion region.

The drain voltage that causes the lightly doped n-type channel 10 in FIG. 1A to be completely depleted just at the drain is defined as $V_{Dsat}$ and this condition is called pinchoff. FIG. 1C shows the depletion region 36 for the JFET shown in FIG. 1A when a battery 32 whose voltage is equal to $V_{Dsat}$ is connected to drain terminal 26 and the source terminal 22 and the metal back electrode 16 are grounded. The pinch-off point is defined as the point at which pinch-off occurs closest to the source. The pinch-off point 40, is shown in FIG. 1C for the case where the drain voltage equals $V_{Dsat}$.

If the drain voltage is increased by $\Delta V$ the pinch-off point moves towards the source a distance $\Delta L$ to a new position 42. FIG. 1D shows the depletion region 36 for the JFET shown in FIG. 1A when a battery 34 whose voltage is equal to $V_{Dsat}+\Delta V$ is connected to drain terminal 26 and the source terminal 22 and the metal back electrode 16 are grounded. The depletion region 36 is enlarged so that over a region of length $\Delta L$ from the pinch-off point 42 to the end of the depletion region 44, the channel is completely depleted. Because only minority carriers remain, the resistance is very large. The drain current flows through this depleted region of length $\Delta L$ resulting in large losses in this high resistance region. These losses reduce the efficiency of the JFET. When the drain voltage is greater than $V_{Dsat}$ the drain current saturates; the drain current does not increase with increased drain voltage.

FIG. 2 shows an n-type enhancement mode MOSFET according to prior art. It consists of a lightly doped p-type semiconductor 90 which makes electrical contact with a metal back electrode 108. A gate terminal 92 is connected to a metal gate electrode 94. A thin insulating layer 96 insulates the metal gate electrode 94 from the lightly doped p-type semiconductor 90. A source terminal 98 is connected to a metal source electrode 99 which makes electrical contact with a source highly doped n+ island 100. The source highly doped n+ island 100 makes electrical contact with the lightly doped p-type semiconductor 90 forming a p-n junction. A drain terminal 102 is connected to a metal drain electrode 104 which makes electrical contact with a drain highly doped n+ island 106. The drain highly doped n+ island 106 makes electrical contact with the lightly doped p-type semiconductor 90 forming a p-n junction. The purpose of said p-n junctions is to restrict the drain current to flow from said source end of the channel to said drain end of said channel.

An n-type enhancement mode MOSFET must be biased by a positive gate voltage. The metal gate electrode 94, the thin insulating layer 96 and the lightly doped p-type semiconductor 90 together form an n-type MOS capacitor. When a sufficiently large positive voltage is applied to the gate electrode 92, electrons start to accumulate in the lightly doped p-type semiconductor 90 at its interface with insulating layer 96, forming a channel from source to drain. Increasing the gate voltage attracts more electrons to this channel thereby reducing the resistance of the channel. A positive DC drain voltage applied to the drain terminal 102 creates a voltage distribution in the lightly doped p-type semiconductor 90 similar to that shown in FIG. 1B for the JFET. This voltage reduces the effect of the gate voltage reducing the number of electrons in the channel. The drain voltage applied to terminal 102 in FIG. 2, which causes the channel to be completely depleted of electrons just at the drain is defined as $V_{Dsat}$ and this condition is called pinch-off. The pinch-off point is defined as the point at which pinch-off first occurs. If the drain voltage is increased by $\Delta V$, the pinch-off point moves towards the source a distance $\Delta L$ as in the JFET. Over the region of length $\Delta L$, the channel is completely devoid of electrons and therefore, the resistance is very large. The drain current flows through this region resulting in large losses. These losses reduce the efficiency of the MOSFET.

In prior art for all FETs, when a voltage $V_{Dsat}$ is applied from the drain to the source in all FETs the channel will pinch-off causing a loss in efficiency.

SUMMARY OF THE INVENTION

In at least one embodiment, a Field Effect Transistor comprises a channel with one end designated as a source and another end designated as a drain. The Field Effect Transistor also comprises a means for connecting electrically to the source end of the channel and a means for connecting electrically to the drain end of the channel. Additionally, the Field Effect Transistor comprises a gate divided into segments each insulated from one another and a means for connecting electrically to each segment of the gate. One or more DC voltage sources are connected to the segments. Each DC voltage source is configured to apply to the segments a bias voltage that is selected to avoid pinch-off and to cause the depletion region to tend to uniformity along the channel.

In an additional embodiment, a Field Effect Transistor comprises a channel with one end designated as a source end and another end designated as a drain end. The Field Effect Transistor also comprises a gate divided into a plurality of segments including at least a first segment and a second segment, wherein the first segment is insulated from the second segment. Additionally, the Field Effect Transistor comprises a plurality of terminals including at least a first terminal and a second terminal. The first terminal applies a first bias voltage to the first segment and the second terminal applies a second bias voltage to the second segment. Further, a relationship between the first bias voltage and the second bias voltage corresponds with a relationship between a first channel voltage within the channel below the first segment and a second channel voltage within the channel below the second gate.

In a further embodiment, a Field Effect Transistor comprises a channel with one end designated as a source end and another end designated as a drain end. The Field Effect Transistor also comprises a gate divided into a plurality of segments including at least a first segment and a second segment, wherein the first segment is insulated from the second segment. Additionally, the Field Effect Transistor comprises a plurality of terminals including at least a first terminal and a second terminal. The first terminal applies a first bias voltage to the first segment and the second terminal applies a second bias voltage to the second segment. The first bias voltage is equal to a first channel voltage within the channel below the first segment, and the second bias voltage is equal to a second channel voltage within the channel below the second gate. Further, the first bias voltage is different than the second bias voltage Additional features and advantages of exemplary implementations of the invention will be set forth in the description which follows, and in part will be obvious from the description, or may be learned by the practice of such exemplary implementations. The features and advantages of such implementations may be realized and obtained by means of the instruments and combinations particularly pointed out in the appended claims. These and other features will become more fully apparent from the following description and appended claims, or may be learned by the practice of such exemplary implementations as set forth hereinafter.

BRIEF DESCRIPTION OF THE DRAWINGS

In order to describe the manner in which the above recited and other advantages and features of the invention can be obtained, a more particular description of the invention briefly described above will be rendered by reference to the appended drawings, which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE INVENTION

In at least one embodiment, the invention is operable within Field Effect Transistors (FET). Under normal operation of an FET, a voltage is applied to the gate here-to-for referred to as the gate voltage, which is comprised of an RF signal and a DC bias voltage here-to-for referred to as the bias voltage. The bias voltage is used to set the average value of the gate voltage. In at least one embodiment, the gate of the FET is divided into segments which are insulated from one another and can be biased separately. Various embodiments are applicable to any FET such as but not limited to n-type JFET, p-type JFET, MOSFET, NMOSFET, PMOSFET, CMOSFET, MNOSFET, DIGMOSFET, HIGFET, TFET and HEMPT, in the enhancement mode and in the depletion mode and FETs with multiple channels and with multiple gates where one or more of the gates is divided into segments as described above.

Figure 1A:
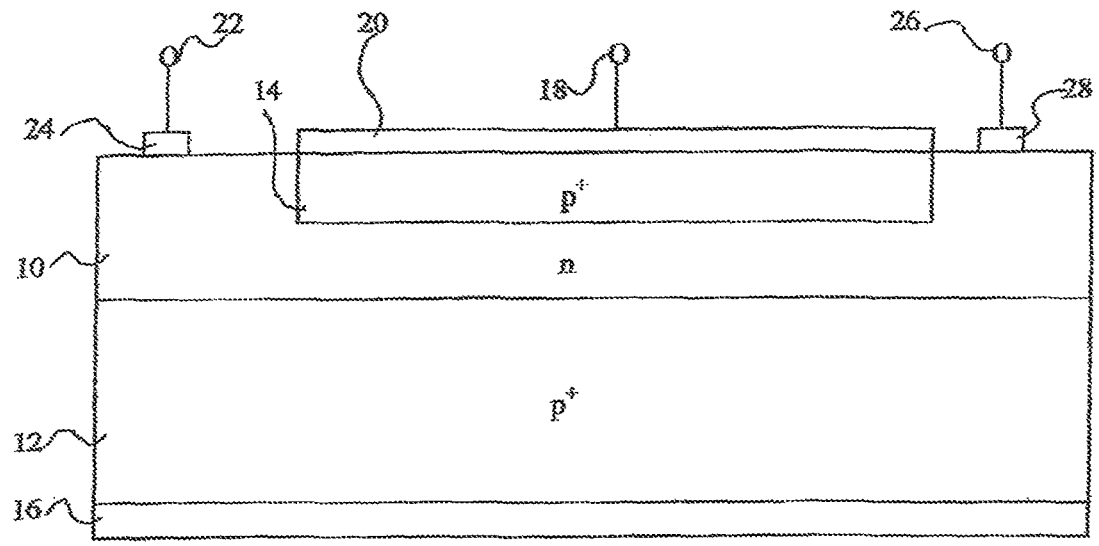
FIG. 1A shows an n-type JFET according to prior art.
Figure 1B:
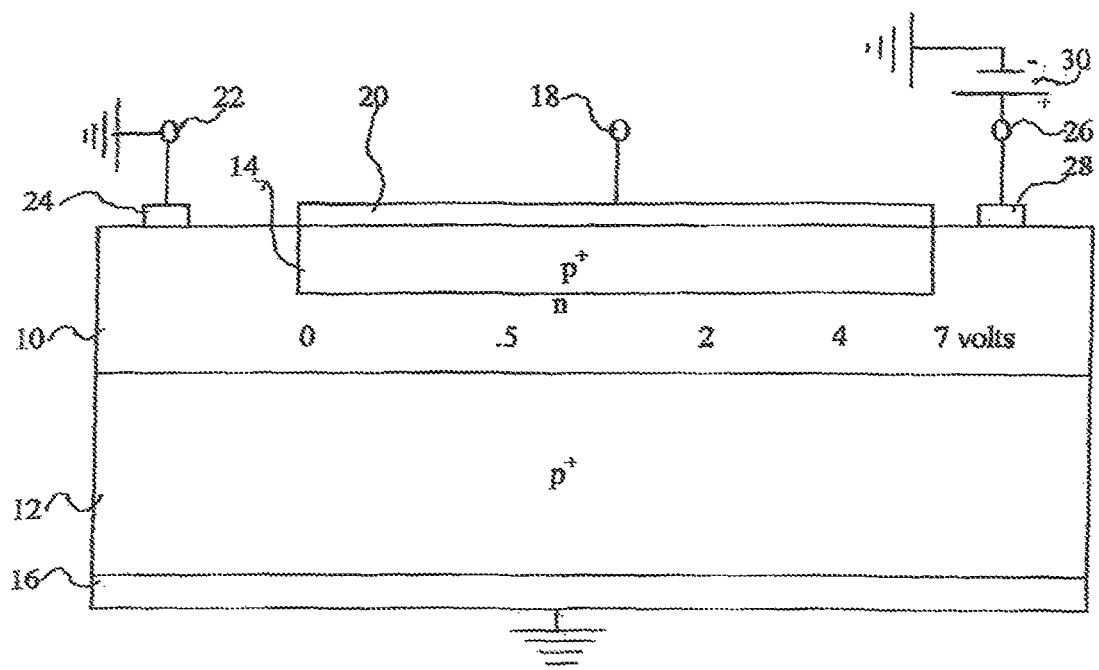
FIG. 1B shows the voltage distribution along the channel for the JFET shown in FIG. 1A, when the drain voltage equals seven volts.
Figure 1C:
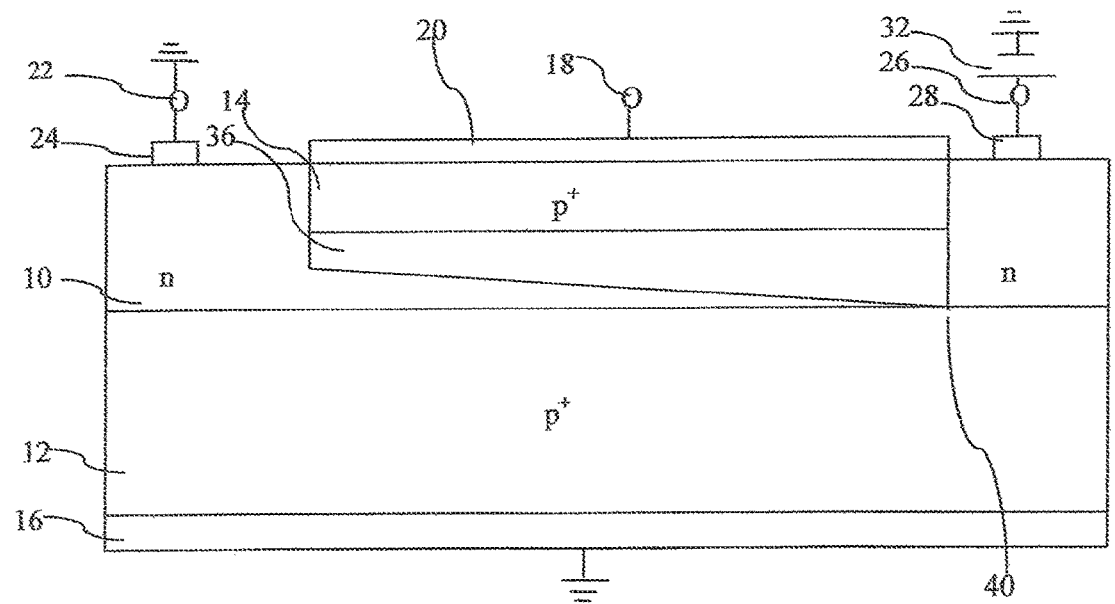
FIG. 1C shows the depletion region in the channel of the JFET when the drain voltage equals VDsat.
Figure 1D:
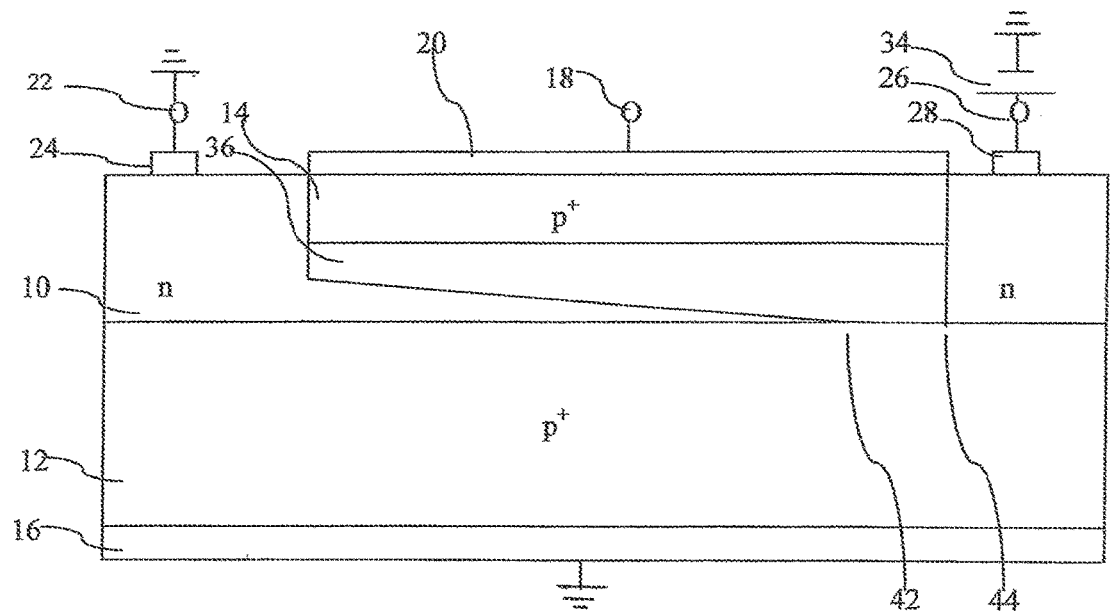
FIG. 1D shows the depletion region in the channel of the JFET when the drain voltage is greater than VDsat.
Figure 2:
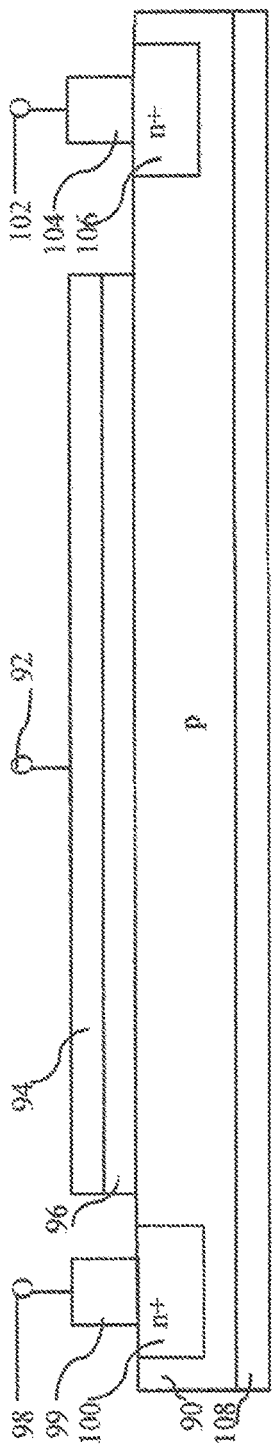
FIG. 2 shows an n-type MOSFET according to prior art.
Figure 3A:
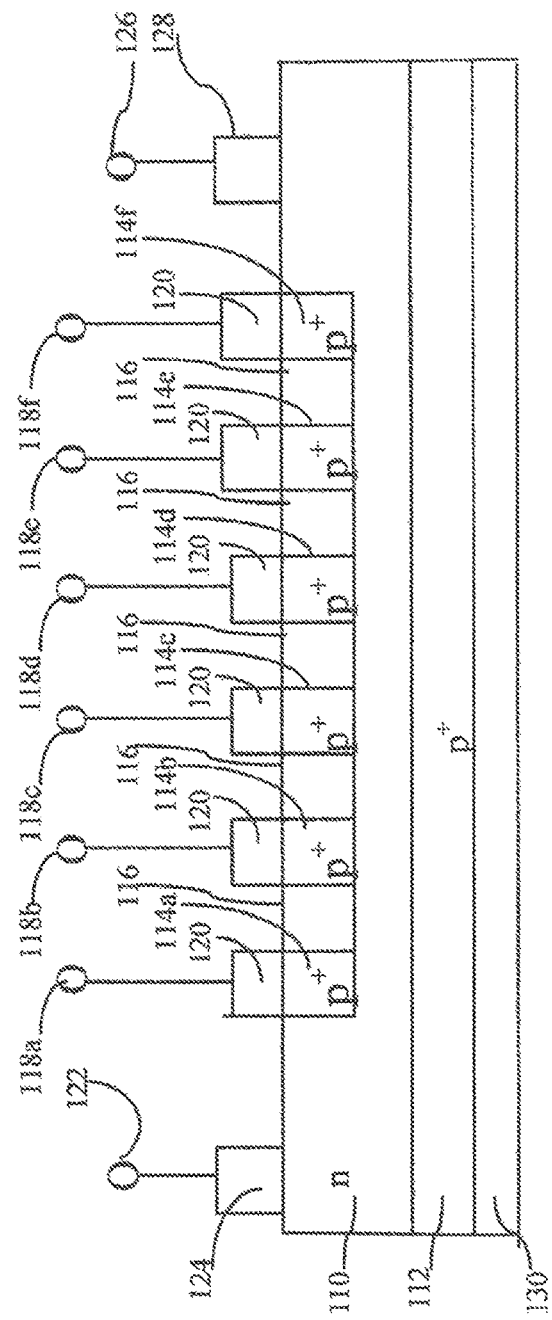
FIG. 3A is an embodiment of the present invention; as an n-type JFET.

FIG. 3A shows an embodiment of a JFET where N, the number of segments within the gate, is equal to six for this example. The active region of the device consists of a lightly doped n-type channel 110 making electrical contact with a highly doped $p^+$ region 112 and forming N, p-n junctions with N, $p^+$ regions 114a, 114b, 114c, 114d, 114e and 114f. The N, $p^+$ regions are each insulated from adjacent $p^+$ regions by an insulator 116. There are N−1, $p^+$ regions 116. N is equal to six as an example in FIG. 3A. The highly doped p+ region 112 makes electrical contact with a metal back electrode 130. A source terminal 122 is connected to a metal source electrode 124, which makes electrical contact with the n-type channel 110. A drain terminal 126 is connected to a metal drain electrode 128, which makes electrical contact with the n-type channel 110. N gate terminals 118a, 118b, 118c, 118d, 118e and 118f are each connected to a separate metal gate electrode 120, which makes electrical contact with the p+ regions 114a, 114b, 114c, 114d, 114e and 114f. In the depicted embodiment, there are N separate gate electrodes 120. As used herein, a terminal comprises any electrical connection to a conductive object or surface. Additionally, as used herein any description of connections or other electrical communication may comprise external and/or internal connections—where external connection comprise wired connected between components and internal connections comprise etched connection between components. As such, in at least one embodiment, a resistor, as described herein, may comprise a portion of etching within a circuit board.

In at least one embodiment, a JFET having the form of FIG. 3A operates as follows. Source terminal 122 provides a means for connecting electrically to said source end of said n-type channel 110. Drain terminal 126 provides a means for connecting electrically to said drain end of said n-type channel 110.

Gate terminal 118a is connected to a metal gate electrode 120, which makes electrical contact with the p+ region 114a. Additionally, gate terminal 118b is connected to a metal gate electrode 120, which makes electrical contact with the p+ region 114b. Similarly, gate terminal 118c is connected to a metal gate electrode 120, which makes electrical contact with the p+ region 114c. Also, gate terminal 118d is connected to a metal gate electrode 120, which makes electrical contact with the p+ region 114d. Further, gate terminal 118e is connected to a metal gate electrode 120, which makes electrical contact with the p+ region 114e. Further still, gate terminal 118f is connected to a metal gate electrode 120, which makes electrical contact with the p+ region 114f. Each of these gate terminals 118(a-f) provide a means for connecting electrically to each segment of the gate. A different voltage can be applied to each gate terminal 118(a-f) allowing each of the segments of the gate to be biased independently of one another.

Figure 3B:
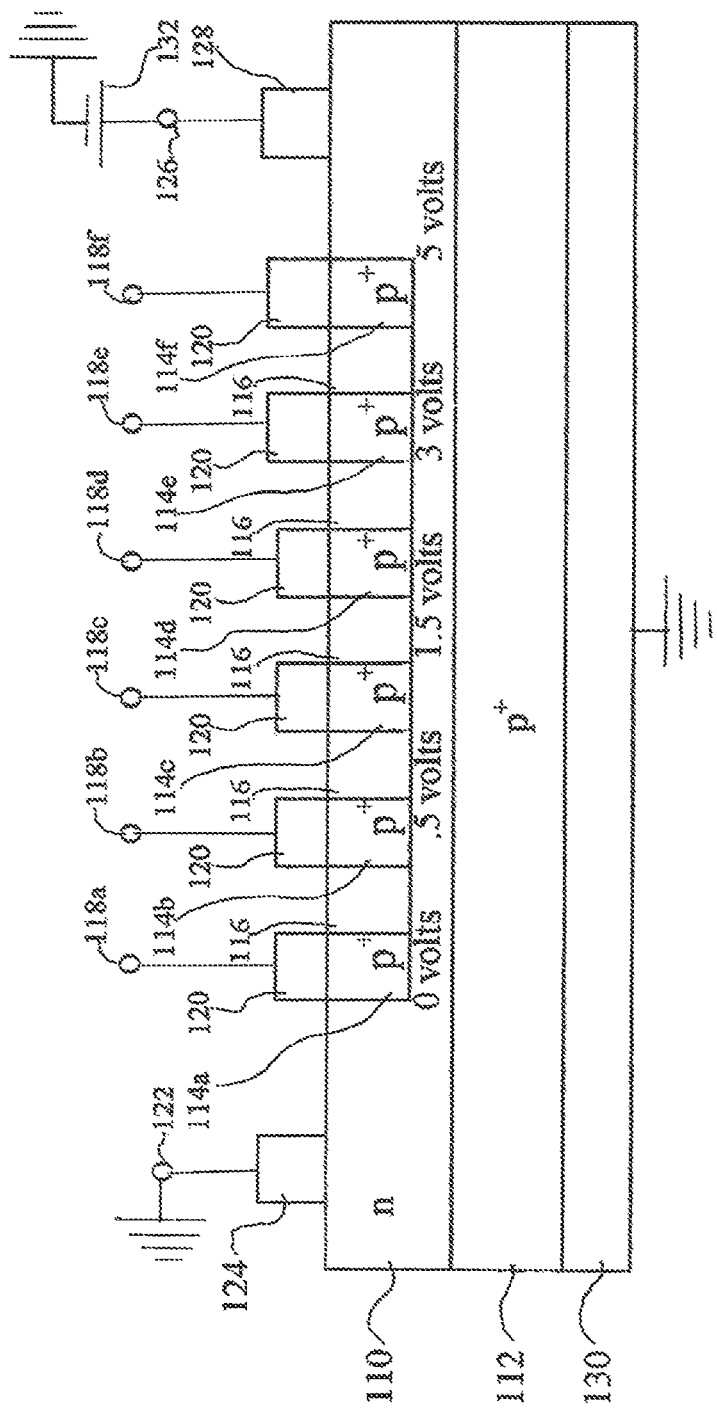
FIG. 3B shows the voltage drop along the channel for the JFET shown in FIG. 3A when a five-volt battery is connected to the drain terminal and the source terminal is grounded.

FIG. 3B shows the approximate voltage distribution along the lightly doped n-type channel 110 for the JFET shown in FIG. 3A, when a voltage is applied to the drain terminal 126, by a five-volt battery 132 and the source terminal 122 and the metal back electrode 130 are connected to ground. The change in voltage per unit length in the channel varies since the resistance of the channel varies due to the variation of the width of the depletion region caused by the five-volt battery 132 connected to drain terminal 126. The voltage in the lightly doped n-type channel 110, due to the five volt drain voltage shown in FIG. 3B, back-biases the p-n junctions. Since each of the N, p-n junctions can be biased separately the N, p-n junctions can be biased to counteract the voltage distribution along the lightly doped n-type channel 110 shown in FIG. 3B. As such, in at least one embodiment, the depletion region will then be uniform and pinch-off will not occur.

Figure 3C:
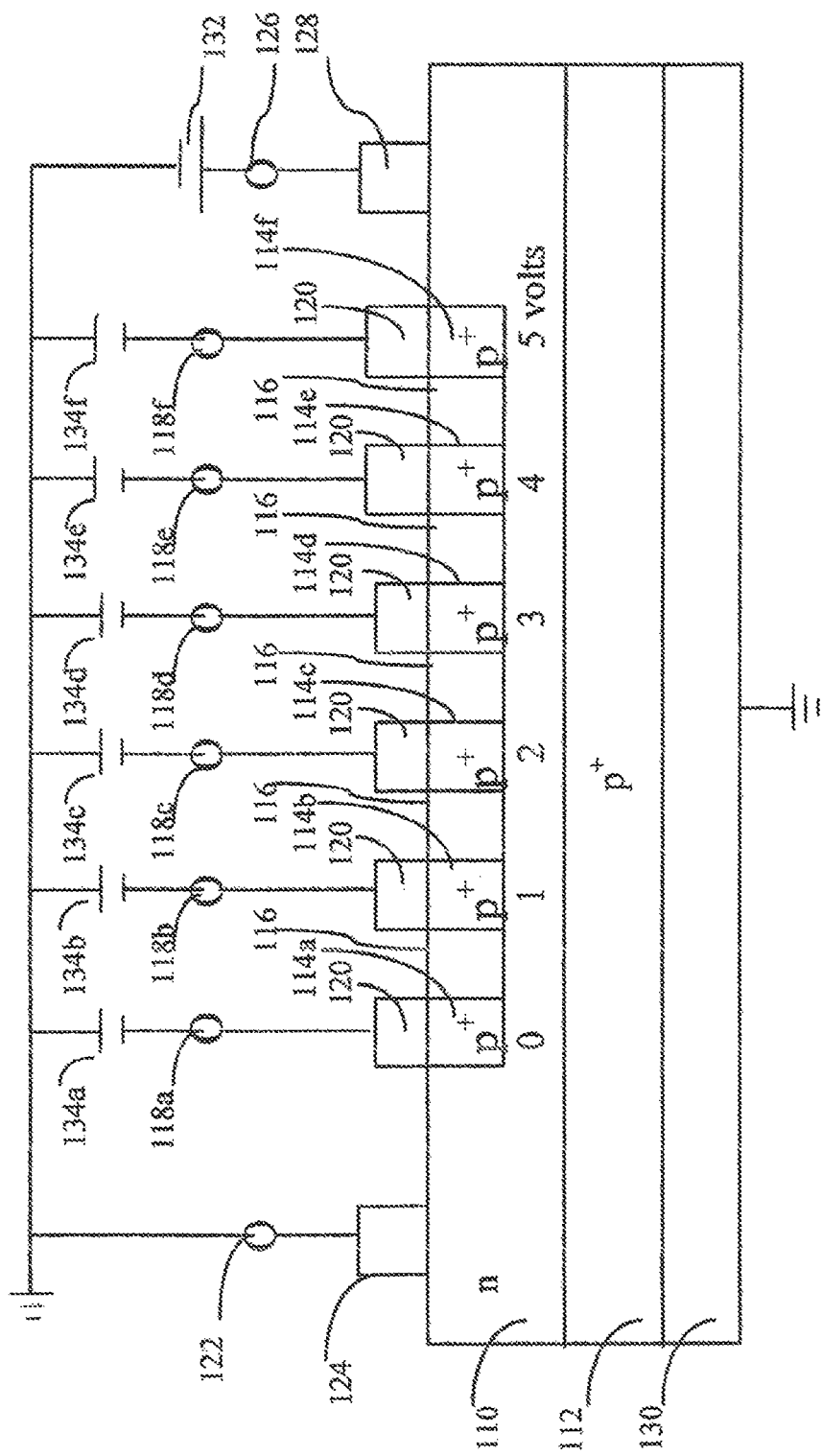
FIG. 3C is an embodiment of the present invention shown in FIG. 3A where each section of the gate is biased by means of a separate battery.

FIG. 3C shows an embodiment of the invention of the JFET in FIG. 3A where each gate terminal is biased with a separate DC voltage source. In the depicted embodiment, a battery 132 with voltage $V_d$ is connected to the drain terminal 126, where $V_d$ equals five volts in the example shown in FIG. 3C. The source terminal 122 and metal back terminal 130 are grounded as shown in FIG. 3C. There are N gate terminals 118a through 118f, where N equals six in the example shown in FIG. 3C. In alternative embodiments, a different number of segments and accompanying gate terminals can be used.

In at least one embodiment, each of the N gate terminals is biased separately, such that the voltage across each p-n junction (comprised of one of the p+ regions 114a, 114b, 114c, 114d, 114e and 114f and the lightly doped n-type channel 110) is equal to V0 where V0<0. The first gate terminal 118a is biased by a battery 134a with a voltage V0. The second gate terminal 118b is biased by a battery 134b with a voltage V0+Δ where Δ is equal to $V_d/(N-1)$. For the example shown in FIG. 3C, Δ equals one. The third gate terminal is biased by a battery 134c with a voltage V0+2Δ and each successive gate terminal is biased by a battery with a voltage increased by Δ.

A biasing arrangement in the form of FIG. 3C operates as follows:

If each of the gate terminals is biased such that all of the p-n junctions are back biased by the same voltage V0, the depletion region will have the same width at each p-n junction and the change in voltage per unit length in the channel will be approximately constant, as shown in FIG. 3C. For instance, the bias voltage at gate terminal 118*d* due to battery 134*d* which biases the fourth p-n junction is V0+3 and the voltage in the channel at the fourth p-n junction is 3 volts. The fourth p-n junction is therefore back biased with voltage V0. As a result of all the p-n junctions being biased with the same voltage, the width of the depletion region is the same all along the channel and pinch-off does not occur.

In the above example, it was assumed that the change in voltage per unit length in the channel was constant, and therefore each successive gate terminal was biased by a battery with a voltage increased by Δ. The batteries can be adjusted from there nominal values when the change in voltage per unit length in the channel is not constant. The biasing arrangement according to this invention can be adjusted such that each p-n junction is back biased with the voltage V0.

The biasing arrangement shown in FIG. 3C is applicable to any FET and is shown in FIG. 3C for a JFET as an example.

Figure 3D:
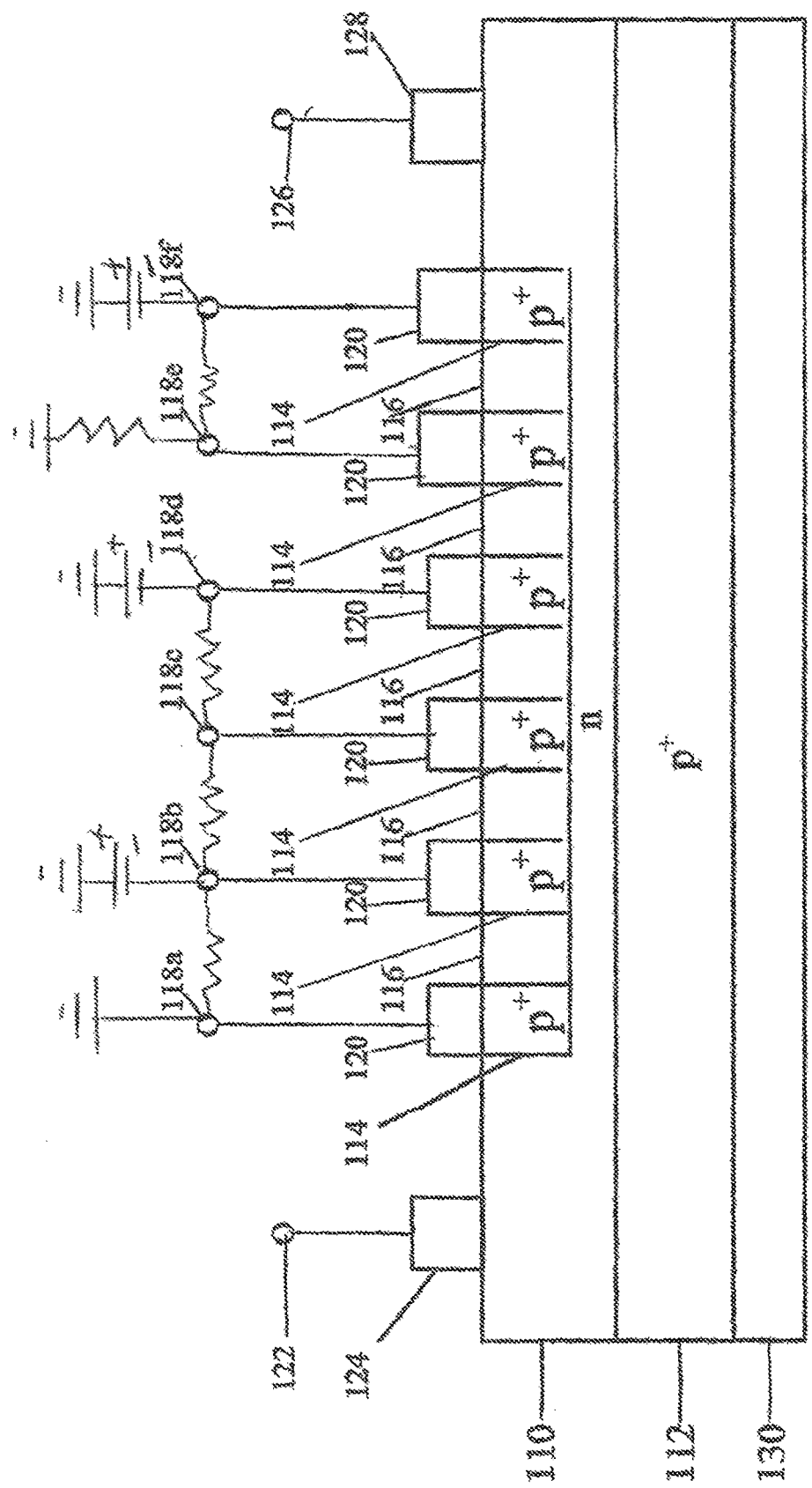
FIG. 3D depicts another embodiment of a bias circuit.

FIG. 3D shows another potential biasing arrangement. In particular, FIG. 3D shows multiple DC voltage sources connected to only a portion of the different terminals with resistors between some of the terminals. One will appreciate in view of FIG. 3D that there exists a wide arrange of different biasing arrangements that can be used to apply desired bias voltages to gate terminals.

Figure 4A:
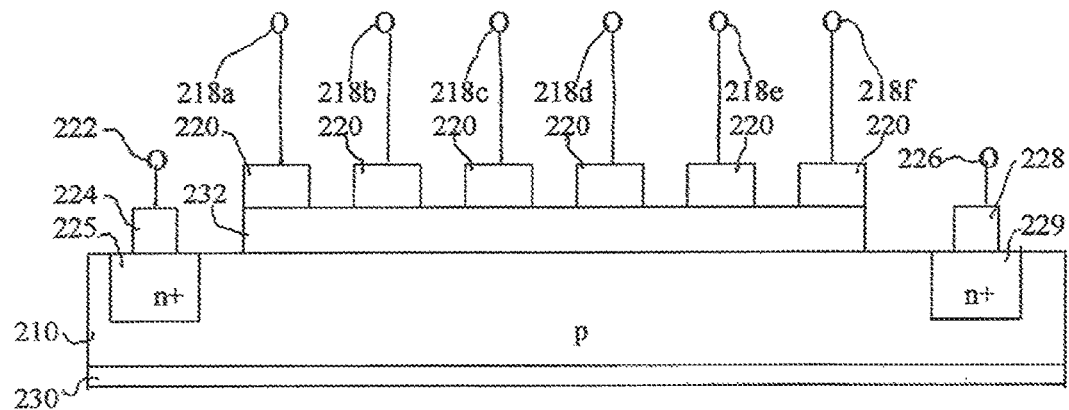
FIG. 4A is an embodiment of the present invention as an n-type MOSFET.

In at least one embodiment, the invention is operable within a MOSFET. FIG. 4A shows an n-type enhancement mode MOSFET according to this invention where N, the number of segments, is equal to six. The active region of an n-type MOSFET consists of a lightly doped p-type semiconductor 210, which makes electrical contact with a metal back electrode 230. A source terminal 222 is connected to a metal source electrode 224, which makes electrical contact with a source highly doped n⁺ island 225. The source highly doped n⁺ island 225 makes electrical contact with the lightly doped p-type semiconductor 210 forming a p-n junction. A drain terminal 226 is connected to a metal drain electrode 228 which makes electrical contact with a drain highly doped n⁺ island 229. The drain highly doped n⁺ island 229 makes electrical contact with the lightly doped p-type semiconductor 210 forming a p-n junction. N, gate terminals 218*a*, 218*b*, 218*c*, 218*d*, 218*e* and 218*f* are each connected to a separate metal gate electrode 220. There are N separate gate electrodes, where N is equal to six as an example in FIG. 4A. A thin insulating layer 232 insulates each of the N metal gate electrodes 220 from the lightly doped p-type semiconductor 210. Each of the metal gate electrodes 220 combined with the insulating layer 232 and the lightly doped p-type semiconductor 210 forms an MOS capacitor.

A MOSFET having the form of FIG. 4A operates as follows. Source terminal 222, provides a means for connecting electrically to said source end of said p-type channel 210. Drain terminal 226 provides a means for connecting electrically to said drain end of said p-type channel 210. N gate terminals 218*a*, 218*b*, 218*c*, 218*d*, 218*e* and 218*f* are each connected to a separate metal gate electrode 220. Each gate terminal provides a means for connecting electrically to each segment of said gate. N is equal to six as an example in FIG. 4A, but could comprise any number of segments greater than 1. A different voltage can be applied to each gate terminal 218(*a-f*) allowing each of the segments of the gate to be biased independently of one another.

Figure 4B:
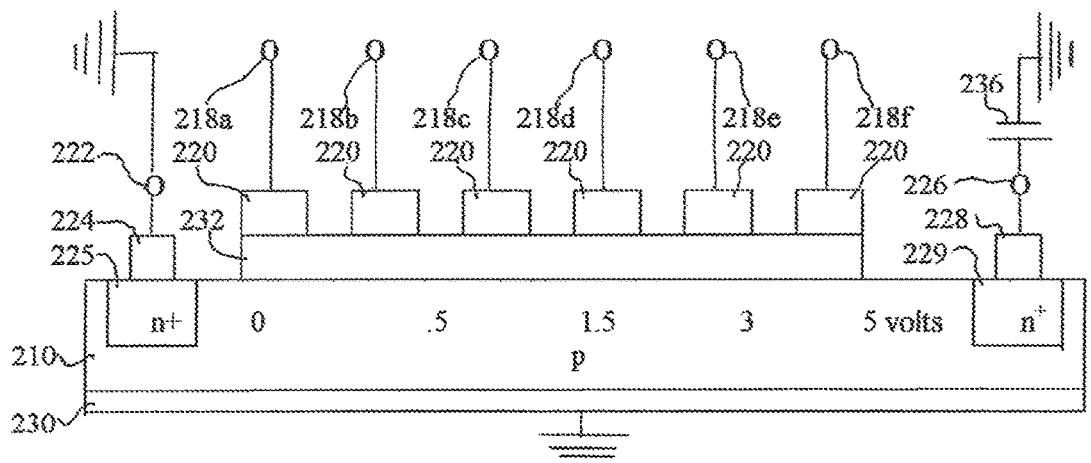
FIG. 4B shows the voltage drop along the channel for the MOSFET shown in FIG. 4A when a five-volt battery is connected to the drain terminal.

An n-type enhancement mode MOSFET must be biased with a positive gate voltage. FIG. 4B shows an approximate voltage distribution along the lightly doped p-type channel 210 for the MOSFET shown in FIG. 4A. In the depicted embodiment, a voltage is applied to the drain terminal 226, by a five-volt battery 236 and the source terminal 222 and the metal back electrode 230 are connected to ground. The change in voltage per unit length in the channel varies since the resistance of the channel varies. This is due to the variation of the width of the depletion region which widens going down the channel from source to drain. The voltage in the lightly doped p-type channel 210, due to the five volt drain voltage, back-biases the MOS capacitors. Since each of the N, MOS capacitors can be biased separately the N, p-n junctions can be biased to counter act the voltage distribution along the lightly doped p-type channel 210 shown in FIG. 4B. The depletion region will then be uniform and pinch-off will not occur.

Figure 4C:
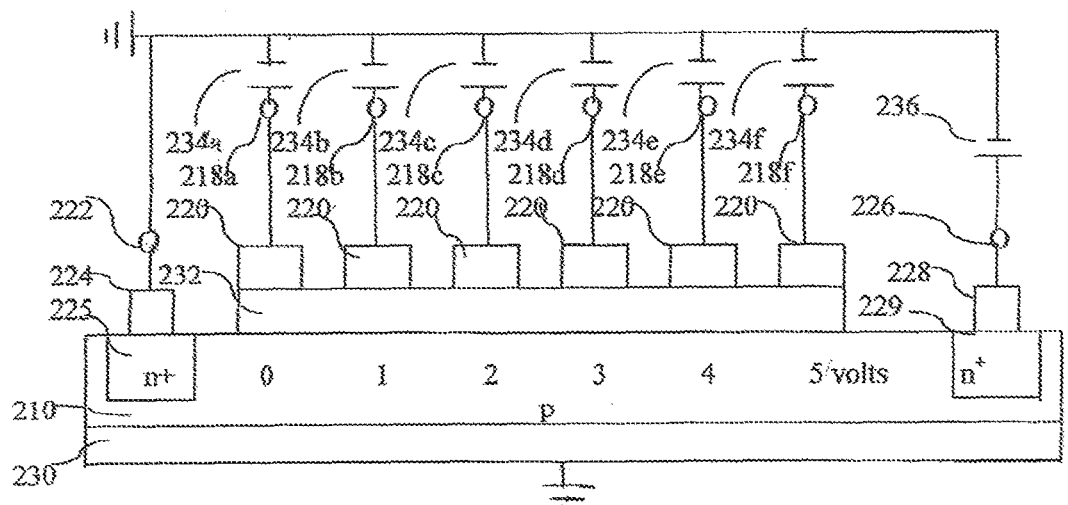
FIG. 4C is an embodiment of the present invention shown in FIG. 4A where each section of the gate is biased by means of a separate battery.

FIG. 4C shows an embodiment of the invention of the MOSFET according to the invention shown in FIG. 4A, where each gate terminal is biased with a separate DC voltage source. A battery 236 with voltage $V_d$ is connected to the drain terminal 226, where $V_d$ equals five volts in the example shown in FIG. 4C. The source terminal 222 and the metal back terminal 230 are grounded as shown in FIG. 4C. There are N gate terminals 218(*a-f*) where N equals six as an example in FIG. 4C. Each of the N, gate terminals is biased separately, such that the voltage across each MOS capacitor is V0, where V0>0. The first gate terminal 218*a* is biased by a battery 234*a* with a voltage V0. The second gate terminal 218*b* is biased by a battery 234*b* with a voltage V0+Δ, where Δ is equal to $V_d/(N-1)$. $V_d/(N-1)$. In the depicted embodiment, Δ equals one. The third gate terminal is biased by a battery 234*c* with a voltage V0+2Δ and each successive gate terminal is biased by a battery with a voltage increased by Δ.

A biasing arrangement in the form of FIG. 4C operates as follows. If the biasing is such that all of the MOS capacitors are back biased by the same voltage V0, the depletion region will have the same width at each MOS capacitor and the change in voltage per unit length in the channel will be approximately constant, as shown in FIG. 4C. The bias voltage for instance at gate terminal 218*d* due to battery 234*d*, which biases the fourth MOS capacitor is V0+3, and the voltage in the channel at the fourth MOS capacitor is 3 volts. The fourth MOS capacitor is therefore back biased with a voltage V0. As can be seen from FIG. 4C, all of the MOS capacitors are back biased with the voltage V0. As a result, the width of the depletion region is the same all along the channel and pinch-off does not occur.

In the above example, it was assumed that the change in voltage per unit length in the channel was constant, and therefore each successive gate terminal was biased by a battery with a voltage increased by Δ. The batteries can be adjusted from there nominal values when the change in voltage per unit length in the channel is not constant. The biasing arrangement according to this invention, can be adjusted such that each MOS capacitor is back biased with the voltage V0. The biasing arrangement shown in FIG. 4C is applicable to any FET according to this invention and is shown as an example in FIG. 4C for a MOSFET.

Figure 4D:
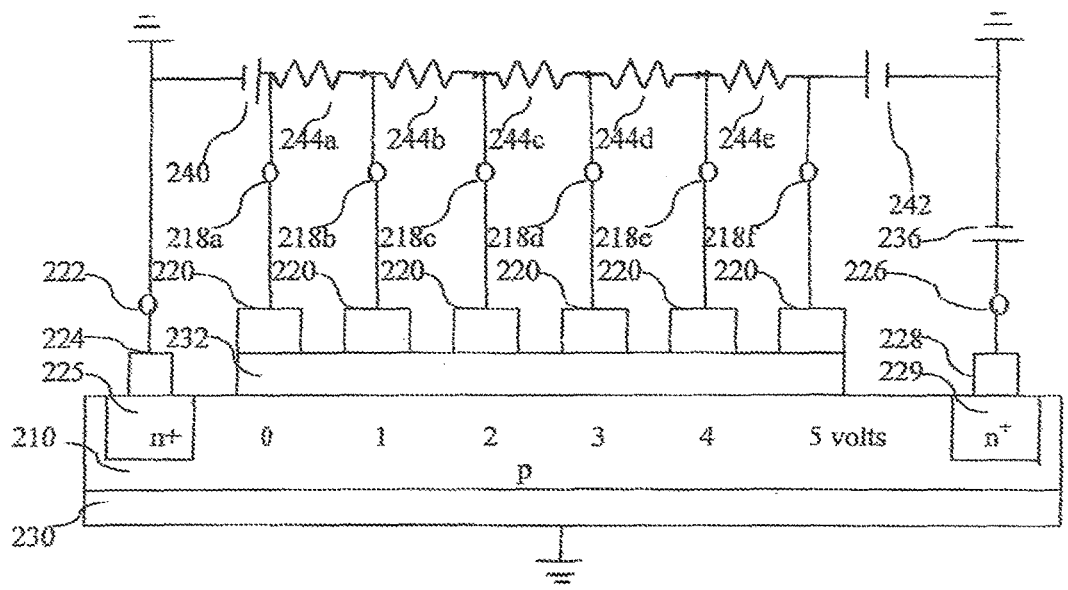
FIG. 4D is an embodiment of the present invention shown in FIG. 4A where each section of the gate is biased by means of two batteries and a resistor network.

FIG. 4D shows an embodiment of a MOSFET according to the invention shown in FIG. 4A where all of the MOS capacitors are biased with a bias voltage of V0, by two batteries and a resistor network. In the example shown in FIG. 4D, N equals six and V0 equals 2 volts. A battery 236 with voltage $V_d$ is connected to the drain terminal 226, where $V_d$ equals five volts in the example shown in FIG. 4D. The source terminal 222 and metal back terminal 230 are grounded. There are N gate terminals 218a through 218f. A two-volt battery 240 is connected between gate terminal 218a and ground. A seven-volt battery 242 is connected between gate terminal 218f and ground. A resistor 244a of value R is connected between gate terminal 218a and gate terminal 218b. R should be a large value of resistance to minimize the power used by the bias network. A resistor 244b of value R is connected between gate terminal 218b and gate terminal 218c. A resistor 244c of value R is connected between gate terminal 218c and gate terminal 218d. A resistor 244d of value R is connected between gate terminal 218d and gate terminal 218e. A resistor 244e of value R is connected between gate terminal 218e and gate terminal 218f.

A biasing arrangement in the form of FIG. 4D operates as follows. Battery 240 biases gate terminal 218a at 2 volts while battery 242 biases gate terminal 218f at 7 volts. There is a five-volt voltage drop between gate terminals 218a and 218f, resulting in a one volt drop across each of the five resistors. Gate terminal 218b is therefore biased at three volts. Gate terminal 218c is therefore biased at four volts. Gate terminal 218d is therefore biased at five volts. Gate terminal 218e is therefore biased at six volts. The change in voltage per unit length in the channel is approximately constant when all of the MOS capacitors are back-biased with the same voltage since the depletion region will have the same width at each MOS capacitor. The voltage distribution in the channel when the change in voltage per unit length in the channel is constant is shown in FIG. 4D. The bias voltage for instance at gate terminal 218d is five volts which biases the fourth MOS capacitor and the voltage in the channel at this MOS capacitor is 3 volts. This MOS capacitor therefore, is back biased by a voltage of 2 volts. As can be seen from FIG. 4D, all of the MOS capacitors are back biased with a voltage of 2 volts. As a result, the width of the depletion region is the same all along the channel and pinch-off does not occur.

In the above example, it was assumed that the change in voltage per unit length in the channel was constant, and therefore each of the resistors have the same value. The values of the resistors can be adjusted from their nominal values when the change in voltage per unit length in the channel is not constant. The biasing arrangement according to this invention can be adjusted such that each MOS capacitor is back biased with the voltage V0. The biasing arrangement shown in FIG. 4D is applicable to any FET according to this invention and is shown in FIG. 4D as an example for a MOSFET.

Figure 4E:
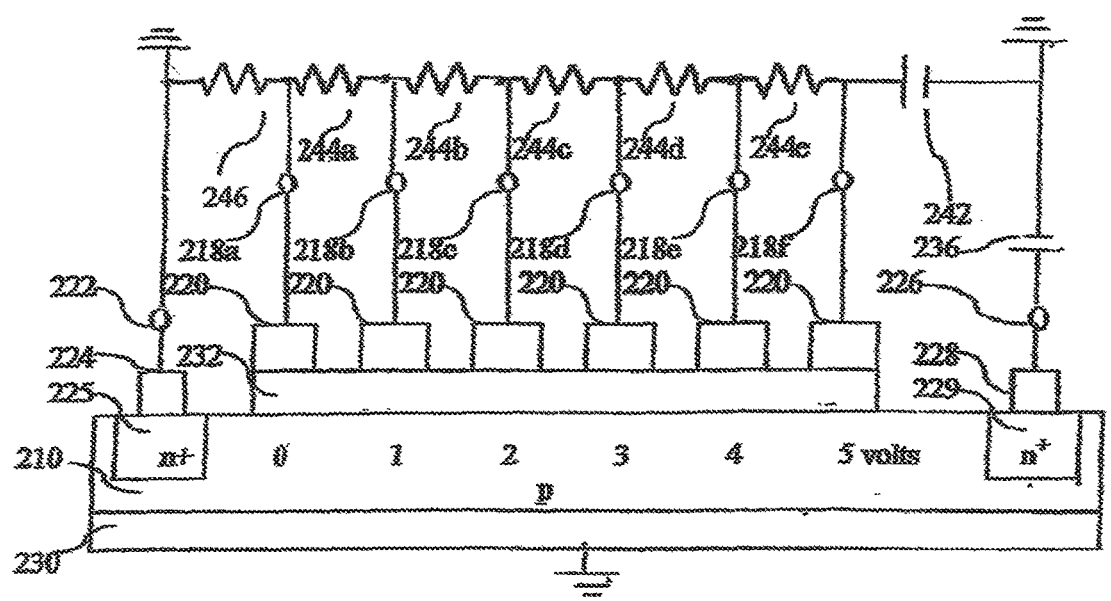
FIG. 4E is an embodiment of the present invention shown in FIG. 4A where each section of the gate is biased by means of a battery and a resistor network.

FIG. 4E shows an embodiment of the invention of the MOSFET according to the invention shown in FIG. 4A where all of the MOS capacitors are biased with a bias voltage equal to V0, by one battery and a resistor network. For the example shown in FIG. 4E, N equals six and V0 equals 2 volts. A battery 236 with voltage $V_d$ is connected to the drain terminal 226, where $V_d$ equals five volts in the example shown in FIG. 4E. The source terminal 222 and metal back terminal 230 are grounded. There are N gate terminals 218a through 218f. A seven-volt battery 242 is connected between gate terminal 218f and ground. A resistor 244a of value R is connected between gate terminal 218a and gate terminal 218b. R should be a large value of resistance to minimize the power used by the bias network. A resistor 244b of value R is connected between gate terminal 218b and gate terminal 218c. A resistor 244c of value R is connected between gate terminal 218c and gate terminal 218d. A resistor 244d of value R is connected between gate terminal 218d and gate terminal 218e. A resistor 244e of value R is connected between gate terminal 218e and gate terminal 218f. A resistor 246 of value 2R (2 times R) is connected between gate terminal 218a and ground.

A biasing arrangement in the form of FIG. 4E operates as follows. Battery 242 biases gate terminal 218f at 7 volts. There is a five-volt voltage drop between gate terminals 218a and 218f, and a 2 volt drop across resistor 246 to ground, resulting in a one volt drop across each of the five resistors 244a, 244b, 244c, 244d and 244e. Gate terminal 218a is therefore biased at two volts. Gate terminal 218b is therefore biased at three volts. Gate terminal 218c is therefore biased at four volts. Gate terminal 218d is therefore biased at five volts. Gate terminal 218e is therefore biased at six volts. The change in voltage per unit length in the channel is approximately constant when all of the MOS capacitors are back-biased with the same voltage since the depletion region will have the same width at each MOS capacitor. The voltage distribution in the channel when the change in voltage per unit length in the channel is constant is shown in FIG. 4E. The bias voltage for instance at gate terminal 218d is five volts and the voltage in the channel at this MOS capacitor is 3 volts. This MOS capacitor is therefore, back biased by a voltage of 2 volts. As can be seen from FIG. 4E, all of the MOS capacitors are back biased with a voltage of 2 volts. As a result, the width of the depletion region is the same all along the channel and pinch-off does not occur.

In the above example, it was assumed that the change in voltage per unit length in the channel was constant, and therefore each of the five resistors 244a, 244b, 244c, 244d and 244e have the same value R and resistor 246 has a value of 2R (2 times R). The values of the resistors can be adjusted from there nominal values when the change in voltage per unit length in the channel is not constant. The biasing arrangement according to this invention can be adjusted such that each MOS capacitor is back biased with the voltage V0. The biasing arrangement shown in FIG. 4E is applicable to any FET according to this invention and is shown in FIG. 4E as an example for a MOSFET.

In at least one embodiment, the disclosed FET is superior to conventional alternatives because there is no pinch-off and hence no high resistance region of length ΔL. This is accomplished by dividing the gate electrode into segments which are insulated from one another and can be biased separately. By biasing each segment separately, it is possible to compensate for the voltage distribution along the channel due to the drain voltage thus minimizing the depletion region and eliminating pinch-off. Minimizing the depletion region results in greater efficiency than can be obtained by prior art. The invention applies to any Field Effect Transistor.

Various means can be used to connect to terminals, segments, voltage sources, and/or biasing networks. In at least one embodiment, such means for connecting can comprise traces, wires, resistive components, capacitive components, inductive components, or any other conductive component. Additionally, as used herein a biasing network comprises one or more circuit components that deliver a voltage to a gate or gate segment.

The present invention is applicable to any FET such as but not limited to n-type JFET, p-type JFET, MOSFET, NMOSFET, PMOSFET, CMOSFET, DIGMOSFET, HIGFET, TFET and HEMPT, in the enhancement mode and in the depletion mode and FETs with multiple channels with multiple gates where one or more of the gates is divided into segments as described above.

FETs of this invention allow the biasing of each segment of the gate electrode individually so that a uniform depletion region can be achieved. Methods of biasing each segment can be, but are not limited to:

1—Individual DC voltage sources such as batteries or DC voltage supplies connected to all or some of the gate terminals.

2—A DC voltage source or a plurality of DC voltage sources in combination with a plurality of resistors or a resistor network connected to all or some of the gate terminals.

Although the description above contains many specificities these should not be construed as limiting the scope of the invention but merely providing illustrations of some of the presently preferred embodiments of this invention.

I claim:

1. A Field Effect Transistor comprising:
   a channel with one end designated as a source end and another end designated as a drain end;
   a means for connecting electrically to the source end of the channel;
   a means for connecting electrically to the drain end of the channel;
   a gate divided into segments each insulated from one another;
   a means for connecting electrically to segments of the gate either externally or internally;
   a bias network connected to said segments, by the means for connecting electrically to segments of the gate, wherein the bias network is configured to apply to the segments of the gate one or more bias voltages that are selected to avoid pinch-off and to cause the depletion region to tend to uniformity along the channel,
   whereby the depletion region in the channel will be reduced, decreasing the ohmic losses in the channel.

2. The Field Effect Transistor of claim 1, wherein the bias network is comprised of one or more DC voltage sources, each of the one or more DC voltage sources being connected to a different segment by the means for connecting electrically to the segments of the gate, wherein the one or more DC voltage sources are configured to apply to the segments of the gate the one or more bias voltages that are selected to avoid pinch-off and to cause the depletion region to tend to uniformity along the channel.

3. The Field Effect Transistor of claim 2, wherein one or more resistors are connected between the segments of the gate by the means for connecting electrically to the segments of the gate, wherein the one or more DC voltage sources in conjunction with the one or more resistors are configured to apply to the segments of the gate the one or more bias voltages that is selected to avoid pinch-off and to cause the depletion region to tend to uniformity along the channel.

4. The field effect transistor of claim 3, further comprising:
   at least one resistor connected to ground; and
   wherein the one or more DC voltage sources in conjunction with the one or more resistors and the at least one resistor are configured to apply to the segments of the gate the one or more bias voltages that is selected to avoid pinch-off and to cause the depletion region to tend to uniformity along the channel.

5. The Field Effect Transistor of claim 1 wherein the Field Effect Transistor, is from a family of Field Effect Transistors comprising a JFET, n-type JFET, p-type JFET, MOSFET, NMOSFET, PMOSFET NMOSFET, MNOSFET, DIGMOSFET, HIGFET, TFET, HEMPT, MESFET, and the CMOSFET in an enhancement mode and in a depletion mode.

6. The Field Effect Transistor of claim 1, wherein:
   the bias network is connected to the segments of the gate, by the means for connecting electrically to segments of the gate; and
   the bias network is configured to apply a first bias voltage selected from the one or more bias voltages to a first segment of the gate and a second bias voltage selected from the one or more bias voltages to a second segment of the gate such that a first difference between the first bias voltage and a first voltage in the channel below the first segment of the gate is approximately equal to a second difference between the second bias voltage and a second voltage in the channel below the second segment of the gate,
   whereby pinch-off is avoided and the depletion region tend to uniformity along the channel.

7. The Field Effect Transistor of claim 6, wherein:
   the first bias voltage applied to the first segment of the gate is different than the second bias voltage applied to the second segment of the gate.

8. The Field Effect Transistor of claim 1, wherein the biasing network comprises:
   a first DC voltage source connected to a first means for connecting electrically to the segments of the gate; and
   a second DC voltage source connected to a second means for connecting electrically to the segments of the gate.

9. The Field Effect Transistor of claim 1, wherein the biasing circuit comprises:
   a first DC voltage source connected to a first means for connecting electrically to the segments of the gate;
   one or more resistors, the one or more resistors connected between at least a portion of the means for connecting electrically to the segments of the gate, wherein:
      the first means for connecting electrically to the segments of the gate is connected externally or internally to a first segment of the gate, and
      a second means for connecting electrically to the segments of the gate is connected externally or internally to a second segment of the gate; and
   at least one resistor connected between a third means for connecting externally or internally to the segments of the gate and ground.

10. A Field Effect Transistor comprising:
    a channel with one end designated as a source end and another end designated as a drain end;
    a gate divided into a plurality of segments including at least a first segment and a second segment, wherein the first segment is insulated from the second segment;
    one or more terminals connected electrically to at least a portion of the plurality of segments; and
    a bias network connected internally or externally to at least a portion of the plurality of segments, by the one or more terminals, wherein the bias network is configured to apply a first bias voltage to the first segment and a second bias voltage to the second segment such that a first difference between the first bias voltage and a first voltage in the channel below the first segment is approximately equal to a second difference between the second bias voltage and second voltage in the channel below the second segment,
    whereby pinch-off is avoided and the depletion region tend to uniformity along the channel.

11. The Field Effect Transistor of claim 10, wherein the Field Effect Transistor, is from a family of Field Effect Transistors designated as JFET, n-type JFET, p-type JFET, MESGET, MOSFET, NMOSFET, PMOSFET NMOSFET, MNOSFET, DIGMOSFET, HIGFET, TFET, HEMPT, and the CMOSFET in an enhancement mode and in a depletion mode.

12. The Field Effect Transistor of claim 10, wherein the bias network comprises one or more DC voltage sources electrically connected to at least a portion of the one or more terminals.

13. The Field Effect Transistor of claim 12, wherein at least a portion of the one or more terminals are connected to a different DC voltage source selected from the one or more DC voltage sources.

14. The Field Effect Transistor of claim 12, wherein the bias network comprises one or more resistors connected internally or externally between at least two terminals selected from the one or more terminals.

15. The Field Effect Transistor of claim 12, wherein the bias network comprises at least one resistor connected to ground.

16. A Field Effect Transistor comprising:
a channel with one end designated as a source and another end designated as a drain;
a gate divided into a plurality of segments including at least a first segment and a second segment, wherein the first segment is insulated from the second segment;
one or more terminals connected electrically internally or externally to at least a portion of the plurality of segments; and
a bias network connected to at least a portion of the plurality of segments, by the one or more terminals, wherein the bias network is configured to apply to the at least a portion of the plurality of segments one or more bias voltages that are selected to avoid pinch-off and to cause the depletion region to tend to uniformity along the channel, whereby the depletion region in the channel will be reduced, decreasing the ohmic losses in the channel.

17. A Field Effect Transistor of claim 16, wherein the bias network is comprised of one or more DC voltage sources, each of the one or more DC voltage sources being connected to a different segment by the means for connecting electrically to the segments of the gate, wherein the one or more DC voltage sources are configured to apply to the segments of the gate the one or more bias voltages that are selected to avoid pinch-off and to cause the depletion region to tend to uniformity along the channel.

18. The Field Effect Transistor of claim 17, wherein one or more resistors are connected between the segments of the gate by the means for connecting electrically to the segments of the gate, wherein the one or more DC voltage sources in conjunction with the one or more resistors are configured to apply to the segments of the gate the one or more bias voltages that is selected to avoid pinch-off and to cause the depletion region to tend to uniformity along the channel.

19. The field effect transistor of claim 18, wherein:
the one or more resistors are connected between the segments of the gate and ground; and
the one or more DC voltage sources in conjunction with the one or more resistors are configured to apply to the segments of the gate the one or more bias voltages that is selected to avoid pinch-off and to cause the depletion region to tend to uniformity along the channel.

20. The Field Effect Transistor of claim 17, wherein the Field Effect Transistor, is from a family of Field Effect Transistors comprising a JFET, n-type JFET, p-type JFET, MOSFET, NMOSFET, PMOSFET NMOSFET, MNOSFET, DIGMOSFET, HIGFET, TFET, HEMPT, MESFET, and the CMOSFET in an enhancement mode and in a depletion mode.

* * * * *